United States Patent [19]
Booth

[11] Patent Number: 5,293,387
[45] Date of Patent: Mar. 8, 1994

[54] METHOD FOR INCREASING THE RESOLUTION OF A DIGITAL FAULT DICTIONARY

[75] Inventor: George L. Booth, Ft. Collins, Colo.
[73] Assignee: Hewlett-Packard Company, Palo Alto, Calif.
[21] Appl. No.: 693,885
[22] Filed: May 1, 1991
[51] Int. Cl.$^5$ .......................................... H03M 13/00
[52] U.S. Cl. ..................................... 371/26; 371/37.7
[58] Field of Search ...................... 371/26, 29.1, 16.5, 371/15.1; 395/575

[56] References Cited

U.S. PATENT DOCUMENTS

| | | | |
|---|---|---|---|
| 3,649,910 | 3/1972 | Vinsani et al. | 371/23 |
| 4,228,537 | 10/1980 | Henckels et al. | 371/26 |
| 4,242,751 | 12/1980 | Henckels et al. | 371/26 |

OTHER PUBLICATIONS

Vin Ratford; "Fault Dictionary Diagnostics: How Well Do They Work?"; Proceedings, ATE East Conference, Jun. 23-26, 1986; pp. III-14 to III-23.
Vin Ratford and Paul Keating; "Integrating Guided Probe and Fault Dictionary: An Enhanced Diagnostic Approach"; 1986 International Test Conference; pp. 304-311.

Primary Examiner—Robert W. Beausoliel, Jr.
Assistant Examiner—Albert Decady

[57] ABSTRACT

A method is described which increases the diagnostic resolution of a fault dictionary 130 used by automated test equipment (ATE) to determine a failed device in a unit under test 120. To achieve the goal of better diagnostic resolution, the method of the present invention first uses a combination of strategies to generate different fault syndromes. If all generated fault syndromes are not the same, then only "possible" fault detection data in the fault dictionary 130 is then used to analyze the syndromes. If all fault syndromes are the same, then only "hard" detection data in the fault dictionary is used to analyze the fault syndromes. Fault resolution is increased by treating the two categories of detection data separately, because there are fewer possible faults in each category than in the situation wherein both fault types are merged.

11 Claims, 3 Drawing Sheets

METHOD FOR INCREASING THE RESOLUTION OF A DIGITAL FAULT DICTIONARY

BACKGROUND OF THE INVENTION

1. Field of the Invention

This invention relates generally to automated test instrument systems, and more specifically, to a method for increasing the resolution of a fault dictionary used by an automated test instrument to functionally test a digital circuit board.

2. Statement of the Problem

Testing of complex digital circuits generally requires the use of computer controlled test instruments, often referred to as automated test equipment ("ATE"). A number of methods have been used to test digital circuit boards, including in-circuit testing and functional testing. In-circuit testing is a method of testing one specific device at a time in the UUT. One type of in-circuit testing uses a mechanically complex "bed-of-nails" fixture to provide electrical access to each pin on each device of the circuit being tested (called a "unit under test", or "UUT"). As VLSI technology advances, circuit board component density increases as more devices are embedded in a single package. In-circuit testing thus becomes more difficult, due to the difficulty of access to large pin-counts per device, and the lack of direct accessibility of the embedded devices.

Functional testing is a method of testing the performance of a UUT without accessing internal nodes. Circuit board-level functional testing requires that the test instrument have access to only the same pins (primary input and/or output pins) that are used for external connection to the circuit board during its normal operation. Under functional test, the circuit board is connected to the test instrument in the same manner as it would be connected to associated circuitry in normal use, typically via edge connectors. Therefore, the physical/electrical access required for functional testing is much simpler than that required for in-circuit testing. However, the observability of a given device in a UUT has been accordingly limited because direct access to each device internal to the UUT is unavailable.

One type of functional testing uses a "fault dictionary" to diagnose a failed (faulty) device in a UUT. A set of signals is applied to the primary inputs of the UUT and the corresponding signals are observed at the UUT's primary outputs. Any observed outputs potentially indicative of a failed device in the UUT are looked up in the fault dictionary to determine whether they are symptomatic of a fault listed in the dictionary. In many cases, a number of potential faults are found in the dictionary which correspond to a given set of observed outputs. Historically, it is this greater than one-to-one correspondence between potential faults and actual faults (i.e., poor resolution) which has been the major drawback to use of the fault dictionary.

Another type of functional testing uses a guided probe (generally hand held) to access nodes in the UUT which help verify the fault or at least narrow the scope of testing. These two types of functional testing are sometimes combined, i.e., a guided probe may be used to locate the failed device from a list of possible failed devices resulting from a fault dictionary analysis.

In order to generate the raw data for a fault dictionary, fault simulation was developed. Fault simulation is an offshoot of normal, or "good," circuit simulation, wherein the logical behavior of a properly operating circuit is modeled in a computer. Unlike "good" circuit simulation, fault simulation predicts the behavior of a circuit containing a failed device. Before fault simulation can take place, a list of possible (preferably probable) faults is determined, typically, by a test engineer. Next, these preselected faults are then introduced, via a computer fault simulator, into a computer simulation of the circuit. The fault simulator then records the resulting circuit behavior for each fault in terms of primary output signals resulting from a set of sequentially applied input signals, called test vectors. Each test vector has a number which corresponds to the rank of its application to a UUT. The primary output signals are typically those which are output via the edge connectors on a circuit board.

If the effects of a test vector applied to a circuit containing a fault propagate through the circuit to a primary output pin, then the fault is said to be detected. A fault that causes a predictable output at a primary output is called a "hard" detection, and a fault which causes an unpredictable output at a primary output pin is called a "possible" or "potential" detection. Unpredictable outputs exist because the output of a circuit depends upon the state of initialization of each device involved in a given signal path. In many cases, a fault prevents a circuit from properly initializing. Thus, whether or not the fault is detected may depend upon various initial device states when the UUT is powered up. Therefore, a "possible detection" occurs when more than one possible output may result from application of a given test vector.

A fault dictionary contains a list of symptoms observable at certain primary outputs of a UUT, given a specified test vector input sequence, and a specified failed (faulty) device. A fault dictionary consists of three elements: a list of fault syndromes, a list of corresponding failed devices (including pin numbers), and a mapping from the former to the latter. A fault syndrome is a failure symptom corresponding to a primary output from a UUT, which output is potentially symptomatic of a failed device in the UUT. A given fault syndrome consists of a specific failing vector number (the number of the applied vector during which execution thereof a failure occurred) and list of corresponding primary outputs. Each fault in the fault list for a particular fault syndrome contains a specific device along with a list of device pins potentially responsible for the failure corresponding to the fault syndrome. Both types of faults—"hard detections" and "possible detections", are typically represented in a fault dictionary.

Traditionally, fault dictionary access programs treated the possible detections in a fault syndrome as "wild cards", allowing the list of possibly detected faults to be merged into the list of hard detections. To access the fault dictionary, the fault syndrome observed on the tester is compared to all the fault syndromes predicted by the fault simulator. Both the failing vector number and all the failed output pins marked as hard detections ("1", "0") must be identical for a match to occur. Failed output pins marked as "X" in the fault dictionary will match either a failed or passing output on the tester, maintaining the accuracy of the fault dictionary in case the possibly detected fault affect all the outputs possible. If a predicted fault syndrome contains many (or all) "X"s, it will tend to match many observed fault syndromes. Therefore, a real fault syndrome seen on a unit under test matches one of the hard detections as well as one or more of the possible detections. This merging of hard and possible detections reduces the fault resolution capability of the fault dictionary by implicating an excessive number of possible faults. Previous automated test instrument systems which utilized fault dictionaries typically treated possible fault detection data ("possible detections") as either equivalent to a "hard" detection or equivalent to a non-detection. An improvement to this prior philosophy was to treat possible detects as UUT failures that may or may not be observed by the automated test instrument. An algorithm was used to merge both possible detections and hard detections of fault syndromes together and then access the data without penalizing mismatches on possible detections. This allowed more accuracy and better resolution compared to the earlier fault dictionaries, but at the same time, added more total faults to the dictionary, due to the inclusion of possible detections. The result was to increase the overall ambiguity of the fault dictionary.

There are well known methods to increase the diagnostic resolution of a fault dictionary by collecting fault syndromes beyond the first failure point (the first "failing vector number"). The test is run until the first failing vector, and the resulting fault syndrome is recorded. The test instrument is then programmed to run to the next failure (a technique not supported on some test instruments) and the fault syndrome at that vector number is recorded. The lists of faults for each syndrome are analyzed for faults common to both (by taking the intersection of the lists), with the other, non-common, faults rejected. If the resulting list does not increase the resolution sufficiently, the test is run to the next failure and the process is repeated. Although this procedure can increase the resolution, it depends on hardware support to run to an arbitrary failed vector. Also, the resulting lists of faults still have hard and possible detections in them, thus limiting the resolution. Lastly, it dramatically increases the fault simulation time to produce a fault dictionary with corresponding multiple failure fault data.

In conclusion, prior methods either: (1) penalized the use of possible detections, (2) did not differentiate between possible detections and hard detections, or (3) considered possible detections to be non-detections. The result of the prior methods' treatment of possible detects is such that the resultant diagnostic resolution provided is significantly less than optimal.

3. Solution to the Problem

Diagnostic resolution in a fault dictionary context is a function of the number of the faults for a given fault syndrome. The fewer faults existing for a given fault syndrome in a fault dictionary, the better the diagnostic resolution.

To achieve the goal of better diagnostic resolution, the method of the present invention uses possible fault detection data (possible detections) as well as hard fault detection data (hard detections) in a digital fault dictionary to locate failed devices on a unit under functional test. Because the method described herein separately treats the two types of detections, the method provides increased resolution in identifying faults as compared to prior methods. Prior methods typically merged the possible detections with hard detections, or weighted or penalized the possible detections as being less significant than hard detections.

By differentiating between "hard detections" and "possible detections" in the fault dictionary, a specific failed device in the UUT may be efficiently located. More specifically, a possible detection occurs when a fault in a device having state memory prevents the device from reaching a known state. Although a given device with state memory powers up in either a "1" or a "0" state, it is equally probable that either state is reached. To correctly simulate such a device, a simulator must assume that an unknown state exists until an applied signal (i.e., a test vector applied to the UUT) drives the device to a known state. Simulators typically assume that any device with state memory is in an unknown ("X") state until it is explicitly forced to a known state ("1" or "0").

In accordance with the present invention, a plurality of test cycles are run on a unit under test (UUT) using combinations of four different strategies in order to provide a number of different fault syndromes. A test cycle is the application of a number of test vectors by an automated test instrument to a UUT. The different fault syndromes are generated by forcing the devices on the UUT to different initial states between test cycles. If differing fault syndromes are obtained for more than one test vector number, the failing primary outputs are merged for all the differing syndromes with the lowest failing vector number, and only the fault dictionary possible detection data for that failing vector number is accessed. If the resulting resolution is not sufficient, that is, if more than an acceptable number of devices are indicated as being possibly faulty, then these possibly failed devices are put into a first list. The failing primary outputs are then merged for the next higher failing vector number, and the possible fault data is accessed for the next higher vector number to produce a second list of possibly failed devices. The intersection of the two lists is then determined, and if the resolution is still not sufficient, then the procedure is repeated, wherein the failing primary outputs in the next higher failed vector number are merged, and the list resulting from accessing the possible detection data is intersected with the result of the previous intersection of lists. The foregoing procedure is continued until the resolution is sufficient or until all fault syndromes have been analyzed.

DETAILED DESCRIPTION OF THE INVENTION

In accordance With the present invention, there has been devised a method for increasing the resolution of a fault dictionary 130 used by an automated test instrument 100 to diagnose failures in a unit under test ("UUT") 120. By differentiating between "hard detections" and "possible detections" in the fault dictionary 130, a specific failed device in the UUT 120 may be efficiently located. More specifically, a possible detection occurs when a fault in a device having state memory prevents the device from reaching a known state. Although a given device with state memory powers up in either a "1" or a "0" state, it is equally probable that either state is reached. To correctly simulate such a device, a simulator must assume that an unknown state exists until an applied signal (i.e., a test vector applied to the UUT) drives the device to a known state. Simulators typically assume that any device with state memory is in an unknown ("X") state until it is explicitly forced to a known state ("1" or "0").

Figure 1:
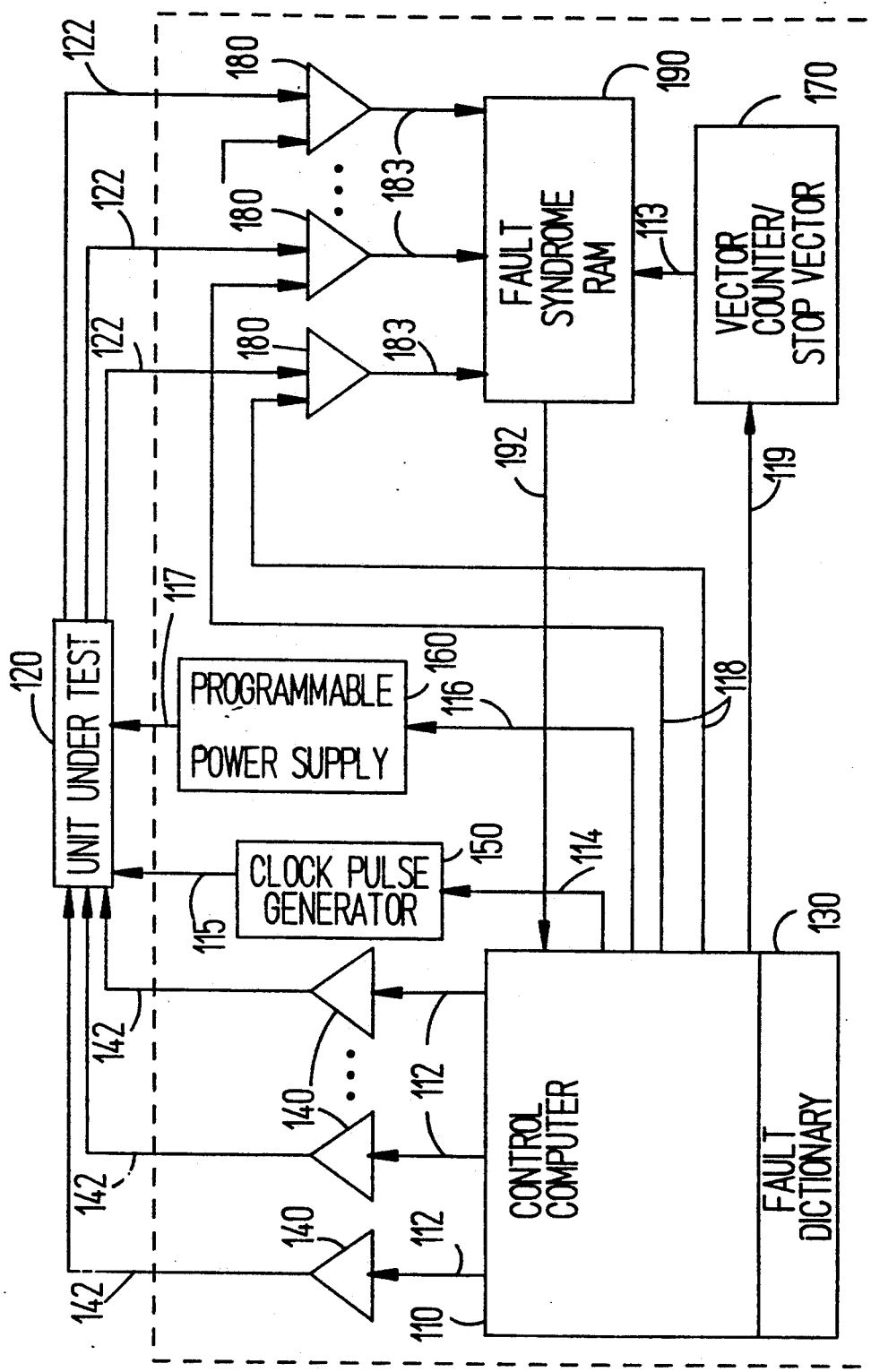
FIG. 1 is a block diagram showing an automated test instrument connected to a unit under test.

FIG. 1 is a block diagram showing an automated test instrument 100 connected to a unit under test (UUT) 120. A control computer 110 having an associated fault dictionary 130 (either in computer memory or on a connected disk drive) is connected via lines 112 to the inputs of a plurality of drivers 140, the outputs of which are connected via lines 142 to the UUT 120. The control computer 110 is also connected via line 114 to a clock pulse generator 150, and via line 116 to a programmable power supply 160, which are connected via lines 115 and 117, respectively, to the UUT 120. The programmable power supply 160 allows the control computer 110 to cycle the power to the UUT 120 between test cycles. The control computer 110 is additionally connected via line 119 to a vector counter/stop vector device 170 which is used to record failing vector numbers and to stop test execution on a given failed vector number. The vector counter/stop vector device 170 is connected, via line 113, to fault syndrome RAM 190 in the automated test instrument 100. The primary outputs from the UUT 120 are connected via lines 122 to the inputs of a plurality of receivers 180 in the automated test instrument 100. The control computer 110 is also connected via lines 118 to the inputs of each of the receivers 180. The outputs of the receivers 180 are connected via lines 182 to fault syndrome RAM 190, which is used for storing fault syndromes for a given test cycle. Fault syndrome RAM 190 used for storing fault syndromes is connected via bus 192 to the control computer 110.

The following simple example is illustrative of the concept of "possible detections": It is assumed that a "stuck-at fault" (wherein a device pin output exhibits a fixed state) is present on a device reset control pin. A test vector set then activates the reset signal at the start of a test, attempting to drive the device to a known state. If the signal is stuck at the "1" (inactive or non-reset) level, the device remains in the "X" state in a test simulation. The simulator assigns an "X" state to the output pin because a device with such a fault under actual test could exhibit either a "1" or "0" output state, depending on the state of the device in which it was powered up or last driven to by test vectors. The simulator software will compare the predicted states of the fault simulation with the states of the good simulation. If the good simulation predicted a "1" or "0" and the fault simulation predicted an "X", the fault is declared "possibly detected", since if the device happened to be in the state predicted by the good simulation, the fault would not be detected.

1. Philosophy of the Method

Since a fault may prevent a circuit from properly initializing, whether or not it is detected depends upon the states of the devices in the circuit when it is powered up. When a circuit having a failed device with a "possibly" detected fault is repeatedly tested, it is observed that the "possible" fault may cause varying circuit outputs. Circuit (or UUT) outputs which are indicative of a failed device, together with the test vector corresponding to the occurrence of the device failure are called "fault syndromes". A failed device having one or more pins designated (by a fault simulator) as "X" eventually causes varying fault syndromes to occur as repetitive testing is conducted, where the initial state of the failed device is varied from test to test. That is, the pins designated "X" in a fault syndrome pass or fail a test apparently randomly on different iterations of the same test. Depending upon the board design and the set of test vectors applied, the different fault syndromes may be observed (1) on the same test vector as different failing pins on the same device, or (2) on different failing vectors, with different failing pins (on the same device) for some or all of the vectors.

The key observation is that, regardless of the initial device states on a UUT, a hard fault always produces the same fault syndrome no matter how many times a given test is run, and a possible fault (possible detection) produces varying fault syndromes. The method of the present invention takes advantage of this fact, by generating a sufficient quantity of differing fault syndromes so that a fault analysis having a relatively high resolution can then be made.

Figure 3:
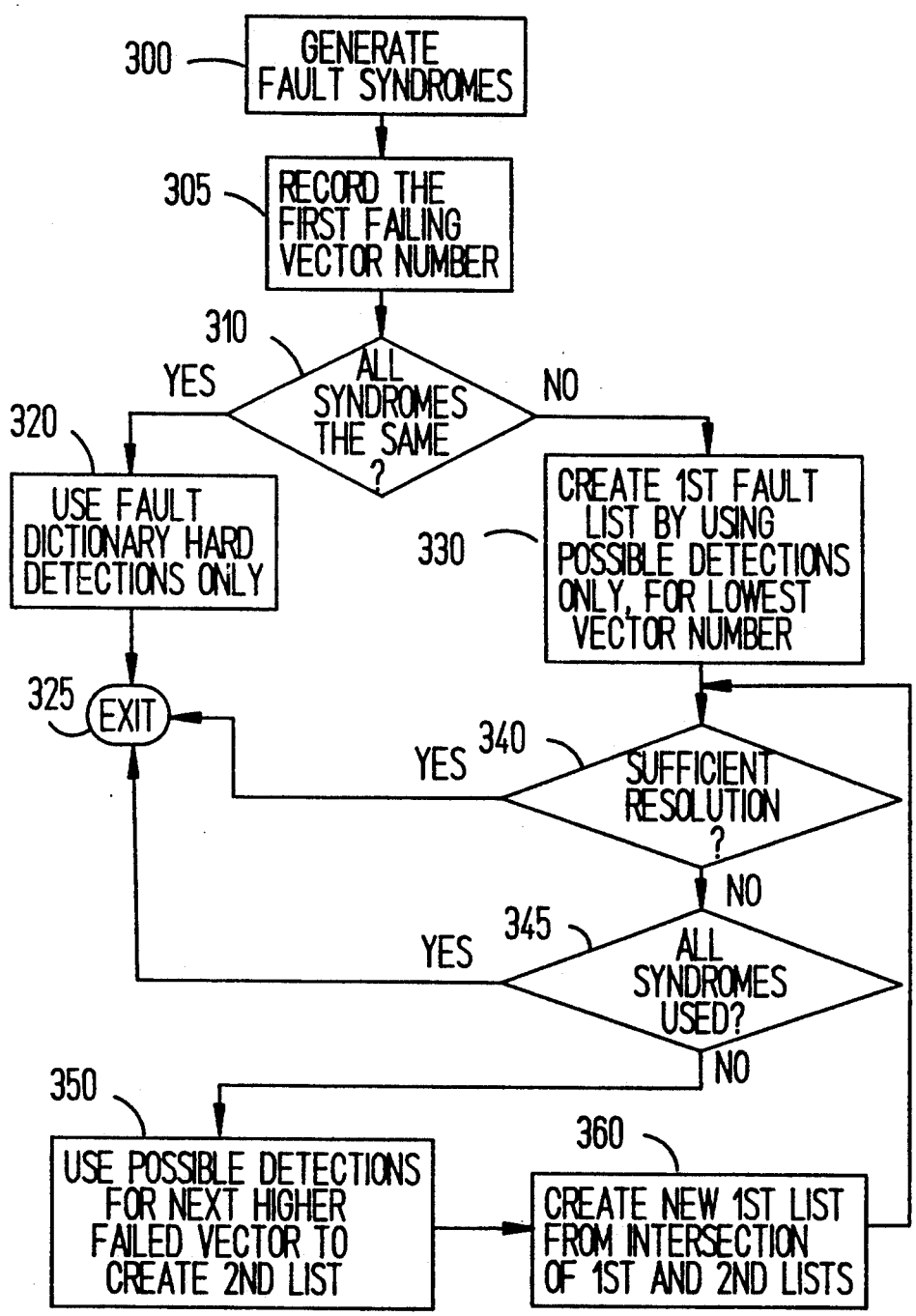
FIG. 3 is a flowchart showing the method of the present invention.

FIG. 3 is a flowchart showing the method of the present invention. In the first step 300 of the method, a plurality of fault syndromes are generated by a using combination of strategies (described below) over a plurality of test cycles. The first failing vector number is then recorded, at step 305, for each test cycle executed. Next, at step 310, the generated fault syndromes are compared to determine whether all of them are the same. If all fault syndromes are the same, then, at step 320, only the fault dictionary 130 hard detection data is accessed to find the failed device(s) corresponding to the fault syndrome. The method is then concluded by exiting at step 325. If, however, at step 310, it is found that one or more fault syndromes differ from any of the other fault syndromes, then, at step 330, only the fault dictionary possible detection data is accessed to create a first list of the potential failed device(s) corresponding to the lowest failed vector number. At step 340, a check is made to determine whether the number of potential failed devices is greater than a predetermined maximum number. If the number of potential failed devices does not exceed the maximum number, i.e., if the fault resolution is sufficient, then, the method is concluded at step 325. If, however, the fault resolution is not sufficient, then, at step 345, a check is made to see if there are any fault syndromes with higher vector numbers. If there are no syndromes with higher vector numbers (i.e., if all fault syndromes have been used) then, the method is concluded at step 325. Otherwise, at step 350, the next highest vector number is located and the fault dictionary possible detection data for this (next highest) vector number is then accessed to create a second list of potential failed devices. At step 360, the intersection of the first and second lists is then taken (i.e., the two lists are "ANDed") to create a new first list of potentially failed devices. Step 340 is then repeated to determine whether the fault resolution is sufficient, and the above method is continued until either the resolution is sufficient, or all fault syndromes have been used.

2. Fault Syndrome Generation

A. In the first step of the present method, at step 300, four strategies are used, either separately, or in combination, to generate a plurality of differing fault syndromes. The "automated" test instrument 100 operator first selects (typically via software options) the strategy or strategies to be used, and the number of times to execute a test. The goal of this selection is to ensure that the UUT 120 has different initial states on each test execution. Differing initial states cause successive fault syndromes to be different if there is a fault in the initialization circuitry corresponding to a possible detection in the fault dictionary 130.

Strategy 1. —Run the Test to the First Failure

By stopping the test at the first failure, the complete set of test vectors will not be executed, leaving the circuitry in a state that differs from the expected state at the end of the test. When the next iteration of a test cycle begins, the initial state of the circuit may not match the previous initial state, causing the test to fail with a different fault syndrome.

Strategy 2. —Run the Test to the Last Vector

This method attempts to produce different initial states by executing all the vectors in test, causing many changes to the state of the circuitry. It is important to be able to constantly monitor the output states of the test to be able to record the fault syndrome when the test first fails.

Strategy 3. —Extra Clock Pulses Between Test Cycles

With strategy 1 or strategy 2, a random number of clock pulses can be sent to the board between test cycles (after the last vector of test cycle n and before the first vector of test cycle n+1). This causes the initial state of the board to be different on different test cycles.

Strategy 4. —Cycle Power Between Test Cycles

Since circuits may power up in a random State, cycling the power supply 160 before each execution of the test produces different initial states for devices on the board.

The first two of the above strategies can be executed on a conventional Hewlett-Packard 3070 automated circuit tester. However, differing fault syndromes could be generated more efficiently by combining the last two strategies with the first two. For example, the operator could run the test on the UUT 10 times (10 test cycles) using 5 test cycles each of strategies 1 and 2, each cycle being alternately interspersed with an execution of strategies 3 and 4.

B. In the second step of the present method, at step 305, the fault syndrome of the first failure (the first "failing vector number") of the UUT 120 is recorded for each test cycle executed. The fault syndrome contains both the failing vector number and a list of the failing primary output pins. This step creates a list of fault syndromes to be analyzed.

3. Fault dictionary 130 Access

Figure 2:
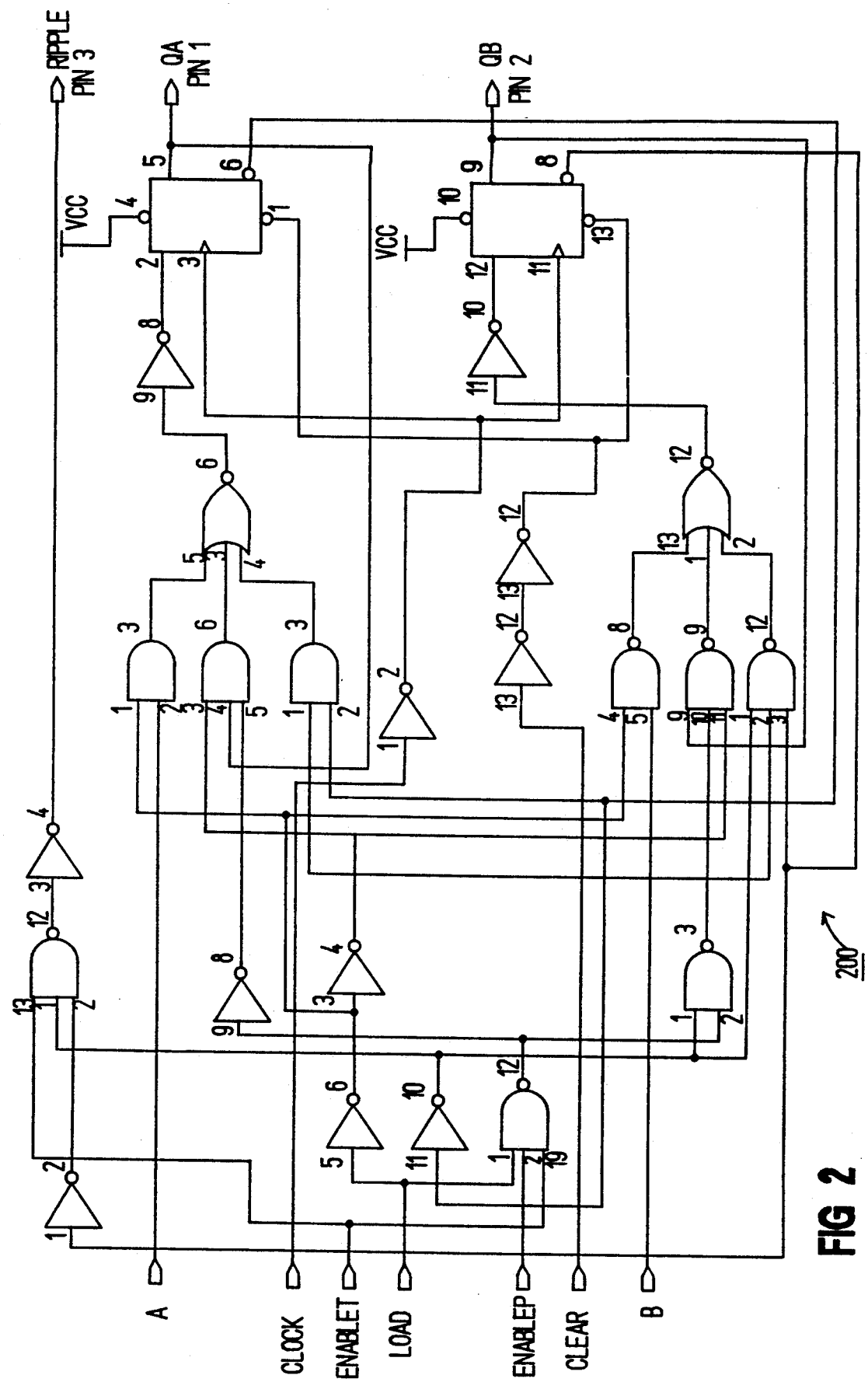
FIG. 2 is a counter circuit logic diagram.

FIG. 2 is a logic diagram of a counter circuit 200, which represents a typical logic circuit in a UUT. The counter circuit 200 is the UUT to which the following examples are applied. The primary outputs of the counter circuit 200 are "ripple" 210, "qa" 212, and "qb" 214. The devices in the counter circuit 200 are labeled u1 through u11. A sample fault dictionary 130 listing of the circuit in FIG. 2 appears below.

Many faults in a complex UUT may be difficult to detect when the behavior of the UUT is observed from only its primary outputs. Therefore, a conventional fault simulator is used to determine the primary output signals ("fault outputs") resulting from a set of signals ("test vectors") which are sequentially applied to a UUT contain predetermined faults. These fault outputs are then grouped by vector number (i.e., the number of the test vector corresponding to the observed primary output). Each grouping of vector number and fault outputs is referred to as a fault syndrome. Corresponding to each fault output for a given vector number is a list of potentially faulty devices in the UUT. These potentially faulty devices are listed in a format which includes the failing device, and the pin number and pin state which is symptomatic of the device failure. A fault dictionary consists of a multiplicity of these fault syndromes, the collection of which correspond to all test vectors applied in a given test (test cycle) of a UUT. The sample fault dictionary 130 illustrated below is similar in format to that used by a Mentor Graphics Corp. QUICKFAULT simulator, and is referred to in the following examples. The fault dictionary 130 illustrated in FIG. 2 is typical of fault dictionaries in the art, and is not a claimed part of the present invention. With respect to the format of the fault dictionary 130 listing, the following should be noted:

(1) The GOOD OUTPUT for each vector number is the expected output for a circuit with no faulty devices;

(2) Each FAULT OUTPUT for a given vector number contains the primary output pins not exhibiting the "GOOD OUTPUT" under fault simulation. For the 3 primary output pins listed for each FAULT OUTPUT: "X" indicates a possible detection of a failing pin, "—" indicates a pin on which the proper output was observed, and a "1" or "0" indicates a hard detection of a failing pin (which should have been a "0" or "1", respectively);

(3) Both GOOD OUTPUTS and FAULT OUTPUTS are listed in the order of primary output pin numbers 1, 2, & 3 (corresponding to pins QA, QB, and RIPPLE, respectively).

(4) The items between braces {} are the "faults" (the potentially failing devices) associated with a given fault output;

(5) "u1.1.SA1" means; device u1, pin 1 Stuck At state "1";

(6) Faults within braces {} are topologically equivalent and cannot be resolved with any fault dictionary-based techniques; and (7) Vectors 1 and 2 did not detect any faults, and vectors 5 through 69 are not shown, for clarity.

| SAMPLE Fault dictionary LISTING | | | |
|---|---|---|---|
| | OUTPUT PINS 1 2 3 QA QB RIPPLE | | |
| VECTOR 3 | | | |
| GOOD OUTPUT: | 0 | 0 | 0 |
| a FAULT OUTPUT: | — | — | 1 |
| | { u4.4.SA1, u4.3.SA0, u10.12.SA0 } | | |
| b FAULT OUTPUT: | — | X | — |
| | { u1.13.SA1 } | | |
| c FAULT OUTPUT: | — | 1 | — |
| | { u1.9.SA1 } | | |
| | { u1.10.SA0 } | | |
| d FAULT OUTPUT: | X | — | — |
| | { u1.1.SA1 } | | |
| e FAULT OUTPUT: | X | X | X |
| | { u4.12.SA1, u4.13.SA0, u3.12.SA0, u3.13.SA1 } | | |
| f FAULT OUTPUT: | 1 | — | — |
| | { u1.5.SA1 } | | |
| | { u1.4.SA0 } | | |
| VECTOR 4 | | | |
| GOOD OUTPUT: | 1 | 0 | 0 |
| a FAULT OUTPUT: | — | X | — |
| | { u1.13.SA1 } | | |

SAMPLE Fault dictionary LISTING -continued

```
b FAULT OUTPUT:    —    1    —
                   { u3.10.SA1, u3.11.SA0 }
                   { u7.9.SA1 }
                   { u8.1.SA1 }
                   { u1.12.SA1, u4.10.SA1, u4.11.SA0,
                   u11.12.SA0, u11.13.SA1, u5.6.SA1,
                   u11.1.SA1, u7.8.SA1, u11.2.SA1,
                   u8.12.SA1 }
c FAULT OUTPUT:    0    —    —
                   { u7.12.SA0, u7.1.SA0, u7.2.SA0,
                   u7.13.SA0 }
                   { u3.2.SA0, u3.1.SA1 }
                   { u3.2.SA1, u3.1.SA0 }
                   { u4.12.SA0, u4.13.SA1, u3.12.SA1,
                   u3.13.SA0 }
                   { u11.4.SA0, u6.3.SA0, u6.1.SA0,
                   u6.2.SA0 }
                   { u1.3.SA0 }
                   { u1.3.SA1 }
                   { u1.2.SA0, u4.8.SA0, u4.9.SA1,
                   u11.6.SA1 }
                   { u1.5.SA0 }
                   { u1.1.SA0 }
d FAULT OUTPUT:    0    1    —
                   { u1.6.SA0 }
e FAULT OUTPUT:    X    X    —
                   { u1.1.SA1 }
f FAULT OUTPUT:    X    X    X
                   { u4.12.SA1, u4.13.SA0,
                   u3.12.SA0, u3.13.SA1 }
```

In the third step (at step 310) of the present method, the fault syndromes from all test cycles are compared. There are two possible cases: either all the fault syndromes are the same, or at least one is different from any of the others.

Examples are presented below for each of the two cases, with the prior art method being compared to the present method. In the examples for the first case, note that the method of the prior art is unable to resolve the actual fault on the UUT 120 to fewer than 3 different devices, while the present method resolves the faults down to a single device.

CASE 1: All Fault Syndromes are the Same

[For case 1, assume that the actual fault is U1.9.SA1 (i.e., device u1, pin 9 stuck at "1")]

The following is an example for case 1 using a typical prior art method. The strategy used to generate fault syndromes is typical of the prior art——the test is run to the first failure, and fault dictionary data for both hard and possible detections is used to determine the potentially failed devices.

| | (Prior art method) | |
|---|---|---|
| Strategy used | Failing Vector No. | Failing Outputs |
| 1st Failure | 3 | QB |

Fault dictionary 130 access of all data for the fault syndrome (failing primary output "QB" for vector number 3) shows seven faults (from fault outputs 3b, c & 3e):

u1.13.SA1, u1.9.SA1, u1.10.SA0, u4.12.SA1, u4.13.SA0, u3.12.SA0, u3.13.SA1

The resolution is 7 faults or 3 devices (u1, u4, and u3).

The above fault outputs (3b, 3c, & 3e) were selected from the total set of syndromes listed for vector number 3 according to the following procedure: First, note that the fault syndromes in the fault dictionary 130 are listed by vector number and the primary output pins—pin 1=QA, pin 2=QB, and pin 3=Ripple. Accordingly, failing outputs corresponding to pin QB would have a "1","0", or an "X" in the pin 2 (middle) position for the "fault output". Thus, in the above example, the fault syndromes corresponding to fault outputs "—X—", "—1—", and "XXX" (3b, 3c, and 3e, respectively) represent potential failed devices u1, u4, and u3 in the UUT 120.

In contrast to the prior art method described above, the method of the present invention accesses only hard detection data in the fault dictionary 130 when all fault syndromes are the same. This means that both the failing outputs and the failing vector numbers must be the same. The following example illustrates the resulting increase in fault resolution for case 1 where the present method is employed.

For purposes of illustration, three of the possible four strategies are used (below) to generate fault syndromes.

Method of the Present Invention

| Strategy used | Failing Vector No. | Failing Outputs |
|---|---|---|
| 1st failure | 3 | QB |
| cycle power | 3 | QB |
| last vector | 3 | QB |
| cycle power | 3 | QB |
| 1st failure | 3 | QB |
| cycle power | 3 | QB |
| last vector | 3 | QB |
| cycle power | 3 | QB |
| 1st failure | 3 | QB |
| last vector | 3 | QB |

Since all fault syndromes are the same (all syndromes are vector number 3 and primary output "QB"), the method of the present invention assumes, at step 310, that the fault on the UUT 120 is a hard detection and accesses only the fault dictionary 130 hard detection data. Fault dictionary 130 access of hard detection data only (using no fault outputs containing "X" states) for the syndrome vector number and primary output "QB" shows two faults (from syndrome 3c):

u1.9.SA1, u1.10.SA0

The resolution is 2 faults or 1 device (both faults are pins on device u1).

It can thus be seen that, in the above example, the method of the present invention resolves the failure in the UUT 120 to a single device (as compared to 3 devices for the prior art method), which allows for optimally efficient repair of the UUT 120.

CASE 2: There are Differing Fault Syndromes

In the second case of the present method, the fault syndromes generated by testing the UUT 120 with multiple strategies (described above) are not all the same. The first two of the following examples illustrate that the relatively poor fault resolution of the prior art method in this situation, due to the merging of the hard detection and possible detection data. The third example shows the increase in fault resolution which results from use of the present method.

[Assume that the actual fault is u3.12.SAO for the following examples.]

The following two examples for case 2 use a typical prior art method. Two examples are shown to illustrate the typical situation wherein different failing outputs result from different applications of the same test to a given UUT.

| 1: | Strategy used | Failing Vector No. | Failing Outputs |
|---|---|---|---|
| | 1st Failure | 4 | QB |

Fault dictionary 130 access of all data for the syndrome: vector number 4, primary output "QB" shows 20 faults (from fault outputs 4a, 4b, 4e, & 4f). Note that fault outputs having both hard detections and possible detections are used:

u1.13.SA1, u3.10.SA1, u3.11.SA0, u7.9.SA1, u8.1.SA1, u1.12.SA1, u4.10.SA1, u4.11.SAO, u11.12.SAO, u11.13.SA1, u5.6.SA1, u11.1.SA1, u.7.8.SA1, u11.2.SA1, u8.12.SA1, u1.1.SA1, u4.12.SA1, u4.13.SA0, u3.12.SA0, u3.13.SA1

The resolution is 20 faults or 7 devices.

The following example uses the same prior art method as in example 1, above, but wherein a different failing primary output (QA) is detected:

| 2: | Strategy used | Failing Vector No. | Failing Outputs |
|---|---|---|---|
| | 1st Failure | 4 | QA |

Fault dictionary 130 access of all data for the fault syndrome "QA" for vector number 4 shows 29 faults (from fault outputs 4c, 4e, & 4f):

u7.12.SA0, u7.1.SA0, u7.2.SA0, u7.13.SA0, u3.2.SA0, u3.1.SA1, u3.2.SA1, u3.1.SA0, u4.12.SA0, u4.13.SA1, u3.12.SA1, u3.13.SA0, u11.4.SA0, u6.3.SA0, u6.1.SA0, u6.2.SA0 u1.3.SA0, u1.3.SA1, u1.2.SA0, u4.8.SA0, u4.9.SA1, u11.6.SA1, u1.5.SA0, u1.1.SA0, u1.1.Sa1, u4.12.SA1, u4.13.SA0, u3.12.SA0 u3.13.SA1

The resolution is 29 faults or 6 devices. In both of the above examples using the prior art method, the fault resolution is relatively low, because the hard detection data has been merged with the possible detection data.

In the method of the present invention, at step 310, if all fault syndromes are not the same, then the observed fault syndromes are categorized by failing vector number. Next, at step 330, the fault syndrome having the lowest failing vector number is selected. The primary output pins for all fault outputs corresponding to that vector number are merged ("ORed") into a first combined fault syndrome for that failed vector. It is then assumed that the fault corresponds to a possible detection, and only the possible detection data in the fault dictionary 130 is accessed to produce a first failed device list. By combining all the failing primary outputs for the vector, much of the ambiguity in the possible detection data is eliminated.

If, at step 340, the resolution obtained by using the lowest failed vector number is not sufficient (i.e., more than a predetermined number of devices are present in the failed device list), then a check is made, at step 345, to determine if any other fault syndromes exist. If at least one other fault syndrome exists, the corresponding primary output pins for all syndromes corresponding to the next higher failed vector number are then merged together to form a second combined fault syndrome. At step 350, the possible detection data is then accessed for the second combined fault syndrome, and a second failed device list is produced. The intersection of the first and second failed device lists is then determined (i.e., the two lists are "ANDed"), at step 360. If more than an acceptable number of devices are still present in the second failed device list (at step 340), then the above procedure is continued until the resulting resolution is sufficient, or until all fault syndromes have been used.

In comparison to the prior art, the present method accesses only possible detection data (i.e., only fault outputs containing at least one "X") in the fault dictionary 130 (because of the differing fault syndromes), and achieves a significantly greater fault resolution. For purposes of example, 3 different strategies are used to generate differing fault syndromes. The strategies are selected by a user, and are typically alternatively interspersed with one another. The strategies may also be selected at random by either a user or by the automated test instrument 100. Note that by using these multiple strategies, more fault syndromes are generated than with the prior art.

Method of the Present Invention

| 3: | Strategy used | Failing Vector No. | Failing Outputs |
|---|---|---|---|
| | 1st Failure | 3 | QB |
| | cycle power | 5 | QB |
| | last vector | 4 | QB |
| | cycle power | 5 | RIPPLE |
| | 1st failure | 4 | QB |
| | cycle power | 4 | QA |
| | last vector | 5 | QB,RIPPLE |
| | cycle power | 3 | QB |
| | 1st failure | 5 | QB |
| | last vector | 4 | QA | a) Observe that the fault syndromes are not all the same, and vector 3 is lowest failed vector. Therefore, all failing primary outputs (in the "failing outputs" column) from all syndromes failing vector 3 are merged to create a combined vector 3 syndrome "QB". The combined fault syndrome for failed vector number 3 is QB because there are no other outputs to be merged.

Fault dictionary 130 access of potential detection data (using only fault outputs containing an "X" for pin QB) for the syndrome shows 5 faults. These 5 faults are used to generate a first failed device list (from fault outputs 3b & 3e only — syndrome 3c is not used because it contains a hard detection for pin QB):

Failed device list 1 u1.13.SA1, u4.12.SA1, u4.13.SA0, u3.12.SA0, u3.13.SA1

The resolution is 3 devices (u1, u3, & u4). Assuming that greater resolution is desired, then the following step is performed:
  b) Merge the failing primary output pins for the next higher failed test vector (vector number 4).

The next higher failed vector is vector number 4. The combined syndrome for vector 4 consists of pins QA and QB.

Fault dictionary 130 access of potential detection data for the combined syndrome (vector number 4 fault outputs having an "X" for pins QA and QB) shows 6 faults (from fault outputs 4e & 4f). These 6 faults are used to generate a second failed device list:

Failed device list 2 u1.1.SA1, u4.12.SA1, u4.13.SA0, u3.12.SA0, u3.13.SA1

The intersection of failed device list 1 and failed device list 2 has 4 faults in common:

New failed device list 1 u4.12.SA1, u4.13.SA0, u3.12.SA0, u3.13.SA1

The resolution is 2 devices (u4 and u3), which is still not ideal, but which is theoretically as good as possible (the 4 faults are topologically equivalent so no further tests using only primary outputs can further resolve them).

It can thus be observed that the fault resolution resulting from application of the present method is relatively high, because the hard detection data has not been merged with the possible detection data. The present method therefore results in a fault resolution which is significantly greater than that achieved with the prior art.

It is to be expressly understood that the claimed invention is not to be limited to the description of the preferred embodiment but encompasses other modifications and alterations within the scope and spirit of the inventive concept.

I claim:

1. A method for determining a failed device in a unit under test, said unit under test having a plurality of inputs and a plurality of primary outputs, said unit under test being connected to an automated test instrument, said automated test instrument having access to a fault dictionary, said fault dictionary containing hard fault detection data and possible fault detection data, said method comprising the steps of:
  generating a plurality of fault syndromes by sequentially applying a set of test vectors to said inputs of said unit under test, each of said fault syndromes corresponding to a vector number and a failing set of said primary outputs from said unit under test;
  in response to the situation wherein all of said fault syndromes are the same, accessing only said hard fault detection data, and excluding said possible fault detection data, in said fault dictionary, said hard fault detection data to be used in determining said failed device; and
  in response to the situation wherein at least one of said fault syndromes is different from any other of said fault syndromes, accessing only said possible fault detection data, and excluding said hard fault detection data, in said fault dictionary, said possible fault detection data to be used in determining said failed device.

2. The method of claim 1 wherein said automated test instrument executes a test cycle by applying said set of test vectors to said unit under test, and wherein the step of generating a plurality of fault syndromes further comprises:
  applying all of a predetermined number of said test vectors to said unit under test, and recording the first failing test vector number and corresponding said fault syndrome.

3. The method of claim 1 wherein said automated test instrument executes a test cycle by applying a plurality of said test vectors to said unit under test, and wherein the step of generating a plurality of fault syndromes further comprises:
  stopping said test cycle when a first said failure of said unit under test occurs.

4. The method of claim 1 wherein said automated test instrument executes a test cycle by applying said set of test vectors to said unit under test, and wherein the step of generating a plurality of fault syndromes further comprises:
  executing, in response to a number input from an operator of said automated test instrument, said number of said test cycles.

5. The method of claim 1 wherein said automated test instrument includes a clock pulse generator for generating clock pulses, said automated test instrument executing a plurality of test cycles, each said test cycle including application of said step of test vectors to said unit under test, and wherein the step of generating a plurality of fault syndromes further comprises:
  applying, to said unit under test, a random number of said clock pulses between said test cycles.

6. The method of claim 1 wherein said unit under test is connected to a power supply, said automated test instrument executing a plurality of test cycles, each said test cycle including application of a plurality of said test vectors to said unit under test, and wherein the step of generating a plurality of fault syndromes further comprises:
  cycling said power supply between said test cycles by shutting off said power supply and then turning on said power supply.

7. The method of claim 1 wherein a plurality of test vectors are applied in numerical sequence to said unit under test, each said fault syndrome having indicia corresponding to a failed said primary output on said unit under test and wherein at least one of said fault syndromes is different from at least one other of said fault syndromes, said method including the additional steps of:
  (a) determining the lowest test vector number in which a said potential failure occurred during said application of said test vectors to said unit under test;
  (b) merging into a first combined fault syndrome, all of said indicia for each of said fault syndromes having the test vector number determined in step (a), said first combined fault syndrome thereby containing only one occurrence of each different one of said indicia;

(c) accessing only said possible detection data in said fault dictionary using said indicia in said first combined fault syndrome to determine a first failed device list containing at least one potentially failed device;

(d) for the situation wherein more than a predetermined number of said potentially failed devices are present in said first failed device list, if a said fault syndrome exists in said fault dictionary having a higher said test vector number than the previous test vector number used to access said fault dictionary, then merging into a second combined fault syndrome, all of said indicia for each of said fault syndromes having the next said higher said test vector number;

(e) accessing only said possible detection data in said fault dictionary using said failing pins in said second combined fault syndrome to determine a second failed device list containing potentially failed devices;

(f) creating a new first failed device list by taking the intersection of said first failed device list and said second failed device list; and (g) repeating steps (d) through (f) until the number of said potentially failed devices present in said first failed device list is not greater than said predetermined number.

8. A method for determining a failed device in a unit under test, said method using a fault dictionary, said fault dictionary containing hard fault detection data and possible fault detection data, said method comprising the steps of:

generating a plurality of fault syndromes, each of said fault syndromes corresponding to a primary output from a said unit under test, said unit under test being connected to an automated test instrument, said automated test instrument having a clock pulse generator for generating clock pulses, said automated test instrument executing a plurality of test cycles, each said test cycle including application of a plurality of test vectors to said unit under test said step of generating being effected by performing at least one of the following strategies, said strategies being selected by an operator of said automated test instrument:

(a) executing a complete said test cycle;
(b) stopping said test cycle when a first said failure of said unit under test occurs;
(c) applying, to said unit under test a random number of said clock pulses between said test cycles;
(d) performing step (c) between iterations of step (a);
(e) performing step (c) between iterations of step (b);
(f) performing step (c) between an occurrence of step (a) and step (b);

in response to the situation wherein all of said fault syndromes are the same, using only said hard fault detection data in said fault dictionary to determine said failed device; and in response to the situation wherein at least one of said fault syndromes is different from any other of said fault syndromes, using only said possible fault detection data in said fault dictionary to determine said failed device.

9. A method for determining a failed device in a unit under test, said method using a fault dictionary said fault dictionary containing hard fault detection data and possible fault detection data, said method comprising the steps of:

generating a plurality of fault syndromes, each of said fault syndromes corresponding to a primary output form a said unit under test said unit under test being connected to an automated test instrument and a power supply, said automated test instrument executing a plurality of test cycles, each said test cycle including application of a plurality of test vectors to said unit under test, said step of generating being effected by performing at least one of the following strategies, said strategies being selected by an operator of said automated test instrument:

(a) executing a complete said test cycle;
(b) stopping said test cycle when a first said failure of said unit under test occurs;
(c) cycling said power supply between said test cycles by shutting off said power supply and then turning on said power supply;
(d) performing step (c) between iterations of step (a);
(e) performing step (c) between iterations of step (b);
(f) performing step (c) between an occurrence of step (a) and step (b);

in response to the situation wherein all of said fault syndromes are the same, using only said hard fault detection data in said fault dictionary to determine said failed device; and in response to the situation wherein at least one of said fault syndromes is different from any other of said fault syndromes, using only said possible fault detection data in said fault dictionary to determine said failed device.

10. In an automated test instrument using a fault dictionary and a plurality of fault syndromes to diagnose a failed device in a unit under test, said test instrument applying a plurality of test vectors in sequence to said unit under test, each said fault syndrome having indicia corresponding to a failed said primary output on said unit under test, a method for using possible fault detection data in said fault dictionary to determine a failed device in said unit under test comprising the steps of in response to the situation wherein all of said fault syndromes are the same, using only said hard fault detection data in said fault dictionary to determine said failed deice; and in response to the situation wherein at least one of said fault syndromes is different from at least one other of said fault syndromes:

(a) determining the lowest test vector number in which a failure occurred during said application of said test vectors to said unit under test;

(b) merging into a first combined fault syndrome, all of said indicia for each of said fault syndromes having the test vector number determined in step (a), said first combined fault syndrome thereby containing only one occurrence of each different one of said indicia;

(c) accessing only said possible detection data in said fault dictionary using said failing pins in said first combined fault syndrome to determine a first failed device list containing at least one potentially failed device;

(d) for the situation wherein more than a predetermined number of said potentially failed devices are present in said first failed device list, if a said fault syndrome exists in said fault dictionary having a higher said test vector number than the previous test vector number used to access said fault dictionary then merging into a second combined fault syndrome, all of said indicia for each of said fault syndromes having a next said higher said test vector number;

(e) accessing only said possible detection data in said fault dictionary using said failing pins in said second combined fault syndrome to determine a second failed device list containing potentially failed devices;

(f) creating a new first failed device list by taking the intersection of said first failed device list and said second failed device list; and (g) repeating steps (d) through (f) until the number of said potentially failed devices present in said first failed device list is not greater than said predetermined number.

11. The method of claim 10 wherein said indicia of said potentially failed device includes a failed primary output list of failing pins on said unit under test.

* * * * *